(12) United States Patent
Herman et al.

(10) Patent No.: US 7,670,882 B2
(45) Date of Patent: Mar. 2, 2010

(54) ELECTRONIC DEVICE FABRICATION

(75) Inventors: Gregory S. Herman, Albany, OR (US); Darin Peterson, Albany, OR (US); Martin Joseph Manning, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 753 days.

(21) Appl. No.: 11/099,132

(22) Filed: Apr. 5, 2005

(65) Prior Publication Data

US 2006/0223241 A1 Oct. 5, 2006

(51) Int. Cl.
*H01L 21/44* (2006.01)

(52) U.S. Cl. .............. 438/142; 438/129; 438/677; 438/686; 257/E29.147; 257/E29.151

(58) Field of Classification Search .......... 438/129, 438/618, 686, 142, 677
See application file for complete search history.

(56) References Cited

U.S. PATENT DOCUMENTS

| | | | |
|---|---|---|---|
| 5,900,160 | A | 5/1999 | Whitesides et al. |
| 6,348,295 | B1 | 2/2002 | Griffith et al. |
| 6,413,790 | B1 | 7/2002 | Duthaler et al. |
| 6,509,085 | B1 | 1/2003 | Kennedy |
| 6,517,995 | B1 | 2/2003 | Jacobson et al. |
| 6,521,489 | B2 | 2/2003 | Duthaler et al. |
| 6,566,153 | B1 | 5/2003 | Yang |
| 6,576,975 | B2 | 6/2003 | Yang |
| 6,599,824 | B1 | 7/2003 | Krivokapic |
| 6,664,027 | B2 | 12/2003 | Griffith et al. |
| 6,686,229 | B2 | 2/2004 | Deane et al. |
| 6,736,985 | B1 | 5/2004 | Bao et al. |
| 6,918,982 | B2 * | 7/2005 | Afzali-Ardakani et al. .. 156/230 |
| 2002/0090565 | A1 | 7/2002 | Griffith et al. |
| 2002/0135039 | A1 | 9/2002 | Yang |
| 2003/0059975 | A1 * | 3/2003 | Sirringhaus et al. ........... 438/99 |
| 2003/0059984 | A1 | 3/2003 | Sirringhaus et al. |
| 2003/0060038 | A1 | 3/2003 | Sirringhaus et al. |
| 2004/0132314 | A1 | 7/2004 | Decre et al. |
| 2004/0159633 | A1 | 8/2004 | Whitesides et al. |
| 2004/0253835 | A1 * | 12/2004 | Kawase ..................... 438/780 |

FOREIGN PATENT DOCUMENTS

WO WO 03/085700 10/2003
WO WO 2004/013922 2/2004

OTHER PUBLICATIONS

Loo et al, Interfacial Chemistries for Nanoscale Transfer Printing, Journal of the American chemical Society, 2002, 124, pp. 7654-7655.*

Yueh-Lin Loo et al., *Interfacial Chemistries for Nanoscale Transferring Printing*, J. Am. Chem. Soc. 2002, 124, 7654-7655, JACS Communications, published on Web Jun. 5, 2002 (2 pgs.).

(Continued)

*Primary Examiner*—Alexander G Ghyka

(57) ABSTRACT

A system performs a method including contact printing one of a wetting agent and a non-wetting agent on a semiconductor and inkjet printing an electrically conductive material proximate said one of the wetting agent and the non-wetting agent.

53 Claims, 9 Drawing Sheets

OTHER PUBLICATIONS

Ute Zschieschang et al., *Flexible Organic Circuits with Printed Gate Electrodes*, Adv. Mater. 2003, 15 No. 14, Jul. 17, pp. 1147-1151 (5 pgs.).

Yueh-Lin Loo et al., *Electrical Contacts to Molecular Layers by Nanotransfer Printing*, Nano Letters 2003 vol. 3, No. 7, pp. 913-917, published on Web May 28, 2003 (5 pgs.).

George M. Whitesides et al., *Soft Lithography*, Angew. Chem. Int. Ed. 1998, 37, pp. 550-575 (26 pgs.).

D.C. Trimbach et al., *New Elastomers for Soft Lithography*, Eindhoven University of Technology—Department of Chemical Engineering—Laboratory of Polymer Technology, Helix, STO 0.26, P.O. Box 513, 5600 MB, Eindhoven, The Netherlands (1 pg.).

*High-resolution microcontact printing of SAMs*, IBM Zurich Research Laboratory, http://www.zurich.ibm.com/st/microcontact/highres/mucp.html, printed from web on Sep. 16, 2004. (2 pgs.).

B. Michel, H. Schmid, *Stamps*, Macromolecules 33 (2000) 3042, IBM Zurich Research Laboratory, http://www.zurich.ibm.com/st/microcontact/stamps/index.html, printed from web on Sep. 16, 2004 (1 pg.).

*Biopatterng*, IBM Zurich Research Laboratory, http://www.zurich.ibm.com/st/microcontact/biopatterning/index.html, printed from web on Sep. 16, 2004 (1 pg.).

*SAMs on Gold*, IBM Zurich Research Laboratory, http://www.zurich.ibm.com/st/microcontact/sams/index.html, printed from web on Sep. 16, 2004 (2 pgs.).

* cited by examiner

ELECTRONIC DEVICE FABRICATION

BACKGROUND

Many electronic devices are formed using subtractive fabrication techniques such as photolithography. Such subtractive fabrication techniques may be complex in nature, capital intensive and time consuming. Such fabrication techniques may not be well suited for low-cost electronic devices.

BRIEF DESCRIPTION OF THE DRAWINGS

FIG. 2A' is a fragmentary sectional view of another embodiment of the base of FIG. 2A according to one exemplary embodiment.

DETAILED DESCRIPTION OF EXAMPLE EMBODIMENTS

Figure 1:
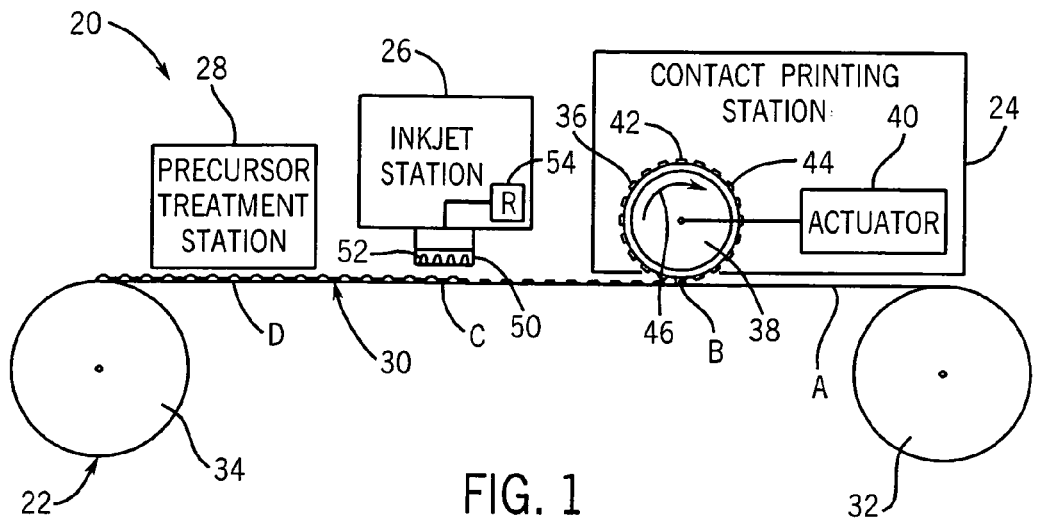
FIG. 1 is a schematic illustration of a fabrication system according to one exemplary embodiment.

FIG. 1 schematically illustrates an electronic device fabrication system 20 configured to fabricate or form electronic devices. System 20 generally includes transport 22, contact printing station 24, inkjet station 26 and precursor treatment station 28. Transport 22 comprises a mechanism configured to move an elongate base 30 of one or more materials or layers between stations 24, 26 and 28. In the particular example illustrated, transport 22 includes feed reel 32 and take-up reel 34. Base 30 comprises one or more layers including a semiconductor layer with which stations 24, 26 and 28 interact. In the particular example illustrated, base 30 comprises an elongate ribbon, strip, belt or band of one or more layers extending between reels 32 and 34. At least one of reels 32, 34 is configured to be rotatably driven by a rotary actuator (not shown) so as to unwind base 30 from reel 34 and so as to wind base 30 about reel 34. In other embodiments, stations 24, 26 and 28 may be configured to create or otherwise interact with other forms of base 30 which may have forms other than a continuous band or winding of material such as a panel, sheet and the like, wherein transport 22 may comprise other mechanisms configured to move base 30 between stations 24, 26 and 28.

Contact printing station 24 comprises one or more devices configured to contact print either a wetting agent or a non-wetting agent upon a semiconductor surface of base 30 in a predefined pattern. In one particular embodiment, contact printing station 24 comprises a micro contact printing station. In other embodiments, contact printing station 24 may comprise a nano contact printing station or a printing station configured to print even smaller, more fine resolutions upon base 30.

In general, contact printing station 24 includes a stamp 36, support 38 and actuator 40. Stamp 36 includes a surface 42 having raised portions 44 which are sufficiently resilient and conformal so as to be brought into conformable contact with the semiconductor surface of base 30 and so as to deposit molecules of the wetting agent or non-wetting agent being carried by the raised portions on the semiconductor surface of base 30 in the pattern which is defined by the pattern of the raised portions. In one embodiment, stamp 36 is formed from a thermal and/or photocurable polymer which may be an elastomeric poly (dimethylsiloxane) (PDMS) material. Other possible stamp materials include polyolefin plastomers (POPs), polyetheresters, polyurethanes, perfluoropolyethers, and many other examples of which may be found in Kyung M. Choi, John A. Rogers' *Novel Chemical Approach to Achieve Advanced Soft Lithography by Developing New Stiffer, Photocurable PDMS Stamp Materials, Materials Research Society Symposium Proceedings,* 820 Nanoengineered Assemblies and Advanced Micro/Nanosystems 147-154 (2004).

Molecules of the wetting agent or non-wetting agent are inked on stamp 36 by either being coated upon stamp 36 or being absorbed into the PDMS in the form of a solid solution. Excess solvent is then removed from stamp 36. During conformal contact with the semiconductor surface of base 30, the molecules of the wetting agent or the molecules of the non-wetting agent (depending on the process chosen) are transferred directly from stamp 36 to the semiconductor surface of base 30. These wetting and non-wetting agents may have attachment groups that bond to the substrate (thiols, isocyanides, siloxanes, phosphonates, carboxylates) and groups that define the hydrophobic and/or hydrophilic properties of the surface they are attached to. Examples of such wetting and non-wetting agents are found in Chapman et al., 122 JACS 8303 (2000).

In one embodiment, stamp 36 may be formed using a micro machine silicone wafer which provides a mold or master into which liquid PDMS is deposited. Upon polymerization, PDMS stamp 36 is de-molded. More details regarding the general process of micro contact printing as used in other distinct applications may be found in Agnew, 37 Chem. Int. Ed., 550-575 (1998).

Support 38 comprises a structure configured to support stamp 36. In the particular example illustrated, support 38 comprises a cylinder or drum about which stamp 36 extends. In other embodiments, support 38 may comprise a plate or have other configurations.

Actuator 40 comprises a device configured to move support 38 and raised portions 44 of stamp 36 into and out of conformal contact with the semiconductor surface of base 30. In the particular embodiment illustrated in which support 30 comprises a cylinder or drum, actuator 40 comprises a rotary actuator configured to rotate support 38 and stamp 36 in the direction indicated by arrow 46. In other embodiments, actuator 40 may have other configurations. For example, in those embodiments in which support 38 comprises a plate supporting stamp 36, actuator 40 may comprise a linear actuator, such as an electric solenoid, one or more hydraulic cylinder assemblies, one or more pneumatic cylinder assemblies or a motor with a cammed arrangement, configured to linearly move the plate of support 38 and stamp 36 into and out of conformal contact with the semiconductor surface of base 30.

Inkjet station 26 comprises a device to inkjet print one or more materials onto the surface of base 30. In particular, inkjet station 26 includes one or more printheads 50 having one or more nozzles 52 in fluid communication with one or more reservoirs 54 containing one or more fluid solutions to be printed (all of which are schematically shown). In one embodiment, inkjet station 26 may include an array of printheads 50 that extend across a width of base 30 so as to print across the width of base 30. In other embodiments, inkjet station 26 may include a carriage configured to move or scan printhead 50 across a width of base 30. In one embodiment, reservoir 54 maybe carried by the carriage or support of the adjacent to printhead 50. In another embodiment, reservoir 54 maybe be part of an off-access ink supply system. In one embodiment, each printhead 50 includes a multitude of thermo-resistive or bubble-jet nozzles. In another embodiment, each printhead 50 includes a plurality of piezo-electric nozzles. However, in other embodiments, other drop-on demand or other continuous ink-jet devices may be utilized.

Precursor treatment station 28 generally comprises one or more devices located along base 30 and configured to treat the solution that has been inkjet printed upon base 30 so as to solidify the solute of the solution. In one embodiment, precursor treatment station 28 comprises a heater configured to thermally anneal the ink-jetted solution upon base 30. In other embodiments, precursor treatment station 28 may comprise other devices configured to solidify the solute inkjet printed upon base 30, such as laser, optical or other treatments. For example, in another embodiment, precursor treatment station 28 may comprise a microwave emitting device for solidifying (and potentially crystallizing) the inkjet solution. One example of such an alternative precursor treatment station is provided on co-pending U.S. patent application Ser. No. 10/885,223 filed on Jul. 2, 2004 by Gregory S. Herman et al. and entitled Structure Formation.

Figure 2A:
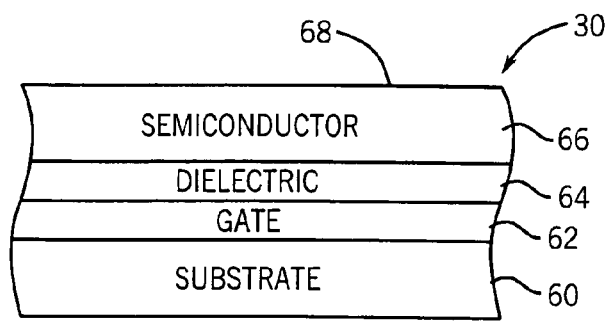
FIG. 2A is a fragmentary sectional view of a base for modification by the system of FIG. 1 according to one exemplary embodiment.
Figure 2A:
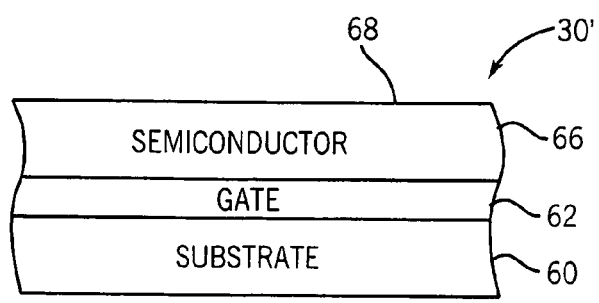

FIGS. 2A-2D illustrate one example process for forming an electronic device using system 20 shown in FIG. 1. FIG. 2A generally illustrates base 30 at location A in FIG. 1. As shown by FIG. 2A, base 30 generally includes multiple layers including substrate 60, gate 62, dielectric 64 and semiconductor 66. Substrate 60 serves as the foundation or platform upon which the remaining layers of materials of the electronic device are supported. In one embodiment, substrate 60 generally comprises a dielectric material such as silicon.

Example of other materials from which substrate 60 may be formed include glasses, coated foils, polyesters, polyethylene terephthalate (PET), polyethylene naphthalate (PEN), Mylar® material, polyimides (e.g. Kapton®), and the like. Substrate 60 may include additional layers (not shown) and may include electrically conductive traces and contacts for electrical connection to gate 62.

Gate 62 generally comprises a layer or area of electrically conductive material. Gate 62 may not necessarily extend across the entire surface of substrate 60. In the particular example shown in which the electronic device comprises a field effect transistor, gate 62 is configured to transmit a signal voltage creating an electrical field in semiconductor 66. In one embodiment, gate 62 is formed from Al. In other embodiments, gate 62 may be formed from other electrically conductive materials such as Ti, Ag, Cu, Au, Ta, Ni, Mo, and the like. Gate 62 may be deposited upon substrate 60 by any of a variety of methods such as spin coating, sputter deposition, inkjet printing, contact printing and the like.

Dielectric 64 generally comprises a layer of electrically insulating material between gate 62 and semiconductor 66. Although dielectric 64 is illustrated as being in direct contact with gate 62 and semiconductor 66, other intermediate layers may be positioned adjacent dielectric 64 such that dielectric 64 is not in direct contact with gate 62 or semiconductor 66. Dielectric 64 insulates gate 62 from semiconductor 66. In one embodiment, dielectric 64 comprises silicon dioxide ($SiO_2$). In other embodiments, dielectric 64 may comprise one or more of other materials such as in organics including silicon nitride ($Si_3N_4$), aluminum oxide ($Al_2O_3$), tantalum pentoxide ($Ta_2O_5$), hafnium(IV)oxide ($HfO_2$), zirconium(IV)oxide ($ZrO_2$) or organic materials or polymers such as polyimides. Dielectric 64 may be deposited upon gate 62 by any of a variety of processes such as sputter coating, chemical vapor deposition, spin coating, inkjet printing, contact printing and the like.

Semiconductor 66 comprises a layer of material along the surface 68 of base 30 configured to selectively conduct electrical current or block its passage based upon the electrical field emitted by gate 62. Semiconductor 66 serves as a channel for current between a source and drain of a source and drain electrode, the addition of which are described in FIGS. 2B-2D.

Figure 2B:
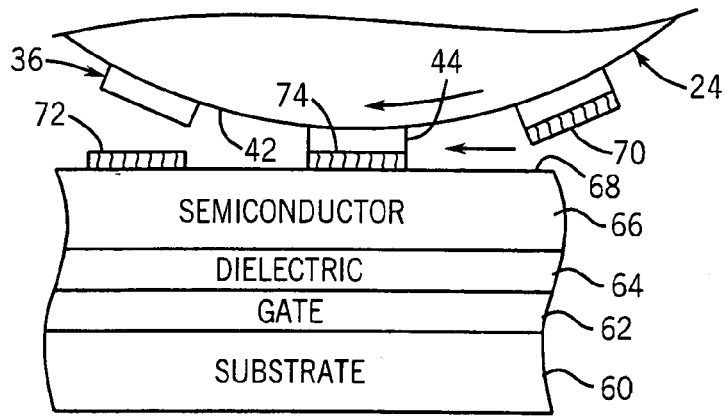
FIG. 2B is a fragmentary sectional view illustrating a contact printing station of the system of FIG. 1 contact printing a non-wetting agent on the base according to one exemplary embodiment.

FIG. 2B illustrates contact printing station 24 contact printing non-wetting agent 70 upon surface 68 of semiconductor 66 at location B in FIG. 1. As shown by FIG. 2B, non-wetting agent 70 is carried by raised portions 44 spaced along surface 42 of stamp 36. Raised portions 44 are spaced from one another such that non-wetting agent 70 is transferred and deposited upon surface 68 at distinct regions, such as regions 72 and 74 on surface 68. In the example shown, regions 72 and 74 upon which non-wetting agent 70 is deposited are spaced from one another by a distance of at least 50 nm, no greater than 500 µm and nominally of about 2 µm. In the particular example illustrated, non-wetting agent 70 comprises tetraoctadecylammonium bromide. In other embodiments, other non-wetting agents may be used such as halogenated silane coupling agents such as tridecafluoro (1,1,2, 2-tetrahydro)-octyltrichlorosilane. In other embodiments, non-wetting agent 70 may have different dimensions depending upon the desired spacing between the source and the drain of the example of field effect transistor being formed.

Figure 2C:
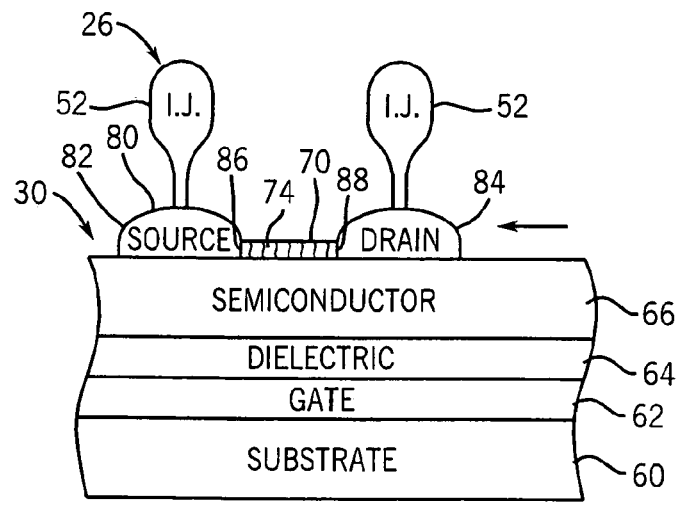
FIG. 2C is a fragmentary sectional view schematically illustrating an inkjet station inkjet printing an electrically conductive material solution on the base of FIG. 2B according to one exemplary embodiment.

FIG. 2C illustrates inkjet printing of electrically conductive material solution 80 proximate to region 74 of non-wetting agent 70. In particular, FIG. 2C illustrates base 30 at location C in FIG. 1 in which nozzles 52 are inkjet printing electrically conductive material precursor solution 80 upon regions 82 and 84 adjacent to opposite sides 86 and 88 of region 74 of non-wetting agent 70. In the particular example illustrated, electrically conductive material solution 80 comprises indium tin oxide precursor solutions. In other embodiments, solution 80 may comprise other solutions such as tin oxide, zinc oxide, indium oxide, Ag, Cu, and Au precursor solutions, containing electrically conductive material.

Figure 2D:
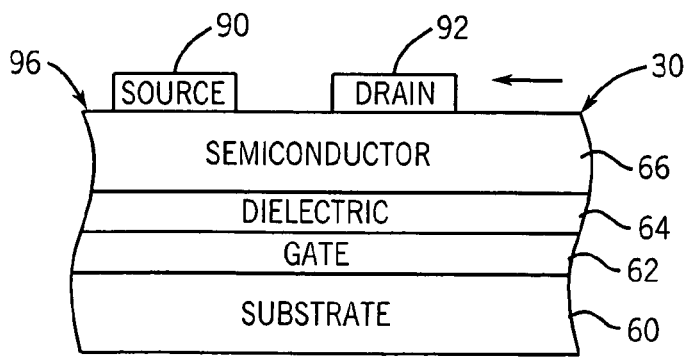
FIG. 2D is a fragmentary sectional view schematically illustrating the base of FIG. 2C after electrically conductive material of the solution has been solidified by a precursor treatment station of the system of FIG. 1 according to one exemplary embodiment.

FIG. 2D illustrates base 30 at location D in FIG. 1. In particular, FIG. 2D illustrates treatment of base 30 such that electrically conductive material solution 80 printed at regions 82 and 84 in FIG. 2C has solidified such that the electrically conductive material of solution 80 forms source electrode 90 and drain electrode 92 on semiconductor 66. In the example shown, source electrode 90 and drain electrode 92 are each formed from an electrically conductive material comprising indium tin oxide. In other embodiments, the electrically conductive material may comprise tin oxide, zinc oxide, indium oxide, Ag, Cu, and Au. Source electrode 90 and drain electrode 92 transmit current across semiconductor 66 upon the establishment of an electrical field across semiconductor 66 by current through gate 62 having a predetermined threshold. Although the electronic device 96 shown in FIG. 2D is illustrated as a metal insulator semiconductor field effect transistor (MISFET), the process described with respect to FIGS. 2A-2D may alternatively be used to deposit and pattern source electrode 90 and drain electrode 92 upon semiconductor 66 in other field-effect transistor devices such as heterostructure field-effect transistors (HFET).

Although FIGS. 2A-2D illustrate contact printing a wetting agent 70 and subsequently inkjet printing an electrically conductive material solution 80 by inkjet station 26 upon a semiconductor 66 which is separated from gate 62 by dielectric 64, the process steps shown in FIGS. 2B, 2C and 2D may alternatively be utilized with a base 30' shown in FIG. 2A'. As shown by FIG. 2A', base 30' omits dielectric 64 such that gate 62 is in direct contact with semiconductor 66. As shown in FIGS. 2B-2D, source and drain electrodes 90 and 92 may be directly be formed upon semiconductor 66 to form a field-effect transistor device such as a junction field-effect transistor (JFET) or a metal semiconductor field-effect transistor (MESFET). The process steps shown in FIGS. 2B-2D would be substantially identically performed with regard to base 30' as with base 30.

Overall, the process described in FIGS. 2A-2D may reduce the cost and complexity of the fabrication of field-effect transistor device 96 while reducing the size and improving the performance of device 96. In particular, the process disclosed in FIGS. 2A-2D uses additive techniques (contact printing and inkjet printing) to deposit the non-wetting agent and the materials of the source and drain electrodes 90 and 92. As a result, relatively complex semiconductor fabrication techniques such as photolithography and subtractive steps such as etching may be reduced or eliminated. The inkjet printing and the micro contact printing shown in FIGS. 2B and 2C are complementary in that they are both effective for large-area patterning in a single step and are compatible with non-planar surfaces. The inkjet printing provides a fast digital patterning technique that may be used with large-area flexible substrates. The micro contact printing is a fast patterning technique that allows for formation of high resolution features. Both the contact printing and the inkjet printing are compatible with reel-to-reel processing for low-cost macro electronic systems. The combination of contact printing and inkjet printing facilitate customization of electronic circuits on the fly with micrometer and nano meter scale resolutions for high resolution definition of channels such as the source, drain and semiconductor and for definition of control and data lines. Because solution 80, ultimately forming source electrode 90 and drain electrode 92, is deposited upon semiconductor 66, improved electrical contact may be achieved between semiconductor 66 and the source and drain electrodes 90, 92.

Figure 3A:
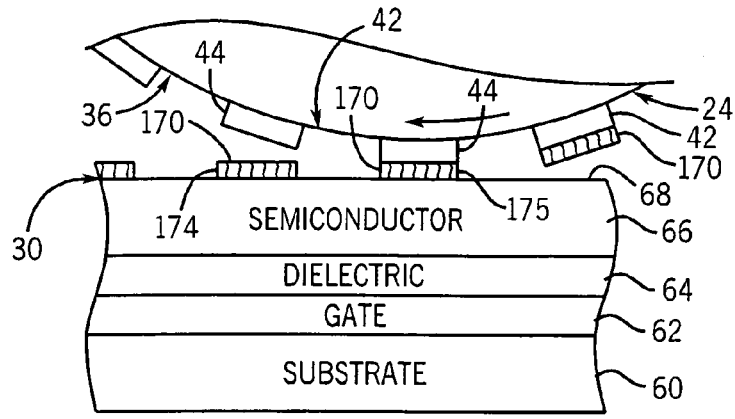
FIG. 3A is a fragmentary sectional view of the contact printing station of FIG. 1 contact printing a wetting agent on the base of FIG. 2A according to one exemplary embodiment.
Figure 3B:
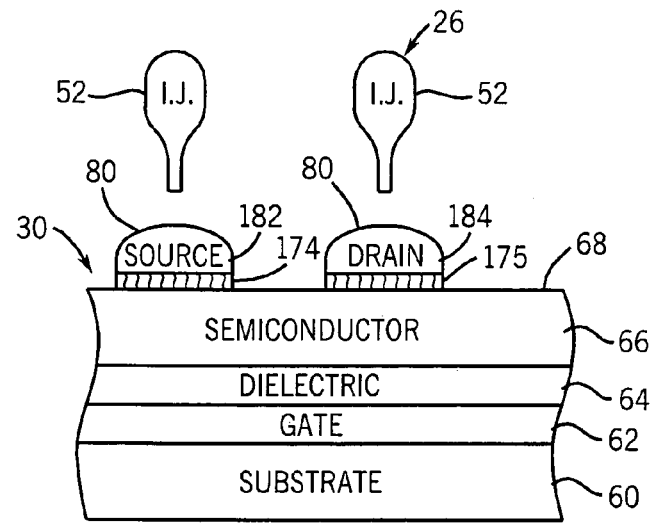
FIG. 3B is a fragmentary sectional view schematically illustrating an inkjet station of the system of FIG. 1 inkjet printing an electrically conductive material solution on the wetting agent of FIG. 3A according to one exemplary embodiment.
Figure 3C:
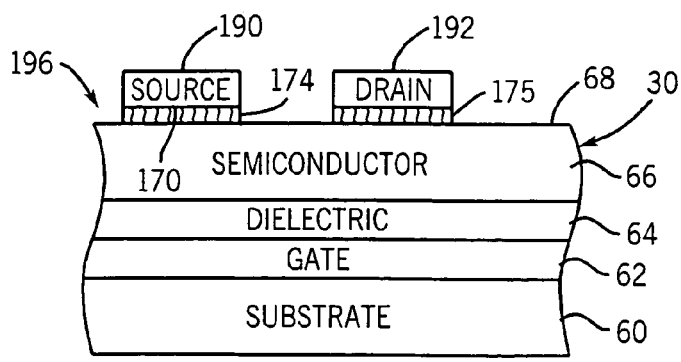
FIG. 3C is a fragmentary sectional view schematically illustrating the base of FIG. 3B after a precursor treatment station of the system of FIG. 1 has solidified electrically conductive material from the solution of FIG. 3B according to one exemplary embodiment.

FIGS. 3A-3C illustrate another embodiment of the process shown in FIGS. 2B-2D. FIG. 3A illustrates contact printing station 24 contact printing a wetting agent 170 on surface 68 of semiconductor 66. In particular, raised portions 44 of stamp 36 carry and deposit wetting agent 170 at two spaced regions 174, 175 of semiconductor 66. In the embodiment shown, wetting agent 170 comprises a compound that leads to hydroxylation of the surface such as potassium hydroxide, sodium hydroxide or other suitable hydroxide. In other embodiments, wetting agent 170 comprise other wetting agents such as pentaerythritol-tetrakis-(3-mercaptoproprionate and other molecules with polar functionality. In the embodiment shown, regions 174 and 175 are spaced from one another by a distance of at least 50 nm, no greater than 500 µm and nominally 2 µm. Each of regions 174 and 175 has a width of at least 50 nm, a maximum width of 500 µm and a nominal width of 0.5 µm.

FIG. 3B illustrates inkjet station 26 inkjet printing an electrically conductive material solution 80 on surface 68 of semiconductor 66. For purposes of this disclosure, the process of depositing one or more materials on surface 68 of semiconductor 66 includes both the deposition of materials directly upon semiconductor 66 or upon a wetting or non-wetting agent which is itself directly upon semiconductor 66. In particular, FIG. 3B illustrates nozzles 52 of inkjet printing station 26 inkjet printing electrically conductive material solution 80 on regions 174 and 175 of wetting agent 170 to form distinct regions 182 and 184 of electrically conductive material solution 80. Although regions 182 and 184 are illustrated as being ink-jetted using two distinct nozzles 52, regions 182 and 184 may alternatively be ink-jetted using a single nozzle, wherein one or both of base 30 and the nozzle 52 are moved relative to one another for inkjet printing the distinct regions 182 and 184. Wetting agents 174 and 175 attract electrically conductive material solution 80 within the shape and boundary of regions 174 and 175. As a result, the shape, dimension and spacing of regions 182 and 184 may be precisely controlled, enabling greater resolution of regions 182 and 184 of solution 180.

FIG. 3C illustrates precursor treatment station 28 (shown in FIG. 1) treating solution 80 so as to solidify electrically conductive material solute within solution 80 upon surface 68 of semiconductor 66 to form source electrode 190 and drain electrode 192 for the electronic device 196. Although source electrode 190 and drain electrode 192 are illustrated as being formed on a semiconductor 66 which is part of an electronic device 196 comprising a MISFET, source electrode 190 and drain electrode 192 may alternatively be formed upon semiconductor 66 which is part of an electronic device 196 alternatively comprising an HFET, a JFET or a MESFET electronic device.

In the particular example shown, the electrically conductive material solute of solution 80 at regions 182 and 184 is solidified by thermal annealing. In other embodiments, solution 80 may be treated so as to solidify the electrically conductive material solute using other methods such as laser and microwave processing, precipitation. Wetting agent 170 may exist in some form at regions 174 and 175 between electrode 190 and electrode 192 after treatment by precursor treatment station 28 as shown by FIG. 3C. In the embodiment disclosed, the remaining portions of wetting agent 170 at regions 174 and 175 has a deminimus effect on the electrical contact between source electrode 190, drain electrode 192 and semiconductor 66. In some embodiments, the remaining wetting agent 170 at regions 174 and 175 may increase the electrical conductivity between source electrode 190, drain electrode 192 and semiconductor 66.

Figure 4:
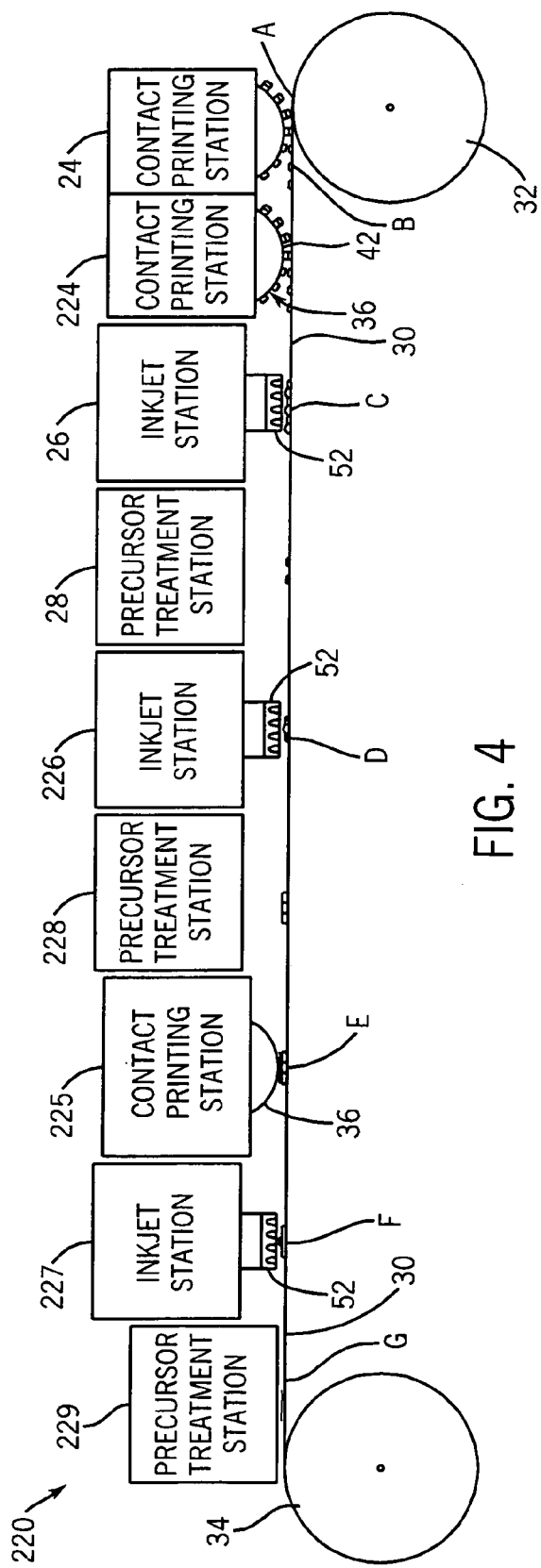
FIG. 4 is a schematic illustration of another embodiment of the fabrication system of FIG. 1 according to one exemplary embodiment.

FIG. 4 schematically illustrates electronic device fabrication system 220, another embodiment of system 20 shown in FIG. 1. System 220 is similar to system 20 except that system 220 additionally includes contact printing station 224, inkjet station 226, precursor treatment station 228, contact printing station 225, inkjet station 227 and precursor treatment station 229. Contact printing stations 224 and 225 are similar to contact printing station 24 except that contact printing stations 224 and 225 may have stamps 36 with differently patterned surfaces 42. In the particular example illustrated where contact printing station 24 is configured to contact print one of a wetting agent and non-wetting agent upon the semiconductor surface of base 30, contact printing station 224 is configured to contact print the other of the wetting agent and the non-wetting agent upon the semiconductor surface of base 30. Contact printing station 225 is configured to contact print one of a wetting agent and a non-wetting agent upon one or more layers of one or more materials that have already been deposited upon the semiconductor surface of base 30. In one embodiment, contact printing station 225 is configured to deposit a wetting agent on a dielectric formed on semiconductor 66 (shown in FIG. 2A) or to deposit a non-wetting agent on one or both of the source electrode 90 or the drain electrode 92 (shown in FIG. 2D). In such embodiments, the spacing between stamp 36 of contact printing station 225 and the semiconductor surface of base 30 may be increased to accommodate the additional layers upon base 30 or base 30 may be supported at a larger spacing relative to stamp 36 of contact printing station 225.

Inkjet stations 226 and 227 are similar to inkjet station 26 except that inkjet stations 226 and 227 may be configured to deposit different materials upon one or more layers or one or more materials that have already been deposited upon the semiconductor surface of base 30. Inkjet stations 226 and 227 may also be configured (operating under the direction of a controller controlling the timing and location of the nozzles 52 (schematically shown) which are fired) to deposit materials in different patterns as compared to inkjet station 26. In one particular embodiment, inkjet station 226 is configured to inkjet print a solution containing a dielectric material while inkjet station 227 is configured to inkjet print a solution containing an electrically conductive material. In one embodiment, inkjet station 226 is configured to inkjet print the dielectric on a wetting agent between a source electrode and a drain electrode on a semiconductor surface of base 30. In one embodiment, inkjet station 227 is configured to inkjet print a solution containing the electrically conductive material onto previously deposited dielectric. In still other embodiments, inkjet stations 226 and 227 may alternatively be configured to inkjet print other materials for forming an electronic device.

Precursor treatment stations 228 and 229 are similar to precursor treatment station 28 except that precursor treatment stations 228 and 229 may be configured to solidify other materials provided in materials provided in solutions that have been inkjet printed upon base 30. In the particular example illustrated, precursor treatment station 228 is configured to solidify dielectric materials within a solution. Precursor treatment station 229 is configured to solidify electrically conductive material that has been inkjet printed by station 227 on base 30. In one embodiment, precursor treatment stations 228 and 229 apply heat to solidify the materials.

In other embodiments, precursor treatment stations 228 and 229 may apply other forms of energy or use other techniques for solidifying materials contained within the ink-jetted solution. In particular embodiments, precursor treatment stations 228 and 229 may be omitted where solidification of solute or driving off of the solvents of the solution occurs by other means such as evaporation.

Figure 5B:
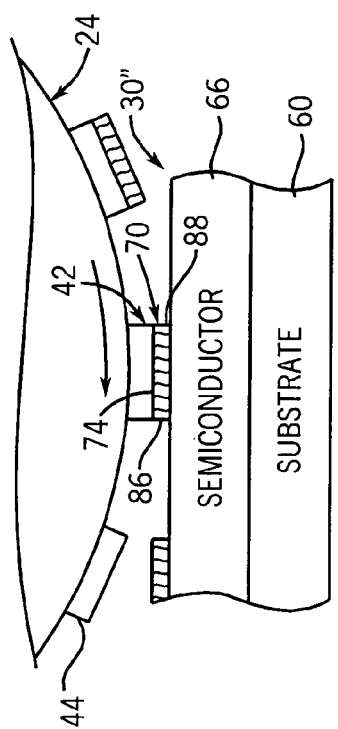
FIG. 5B is a fragmentary sectional view of a contact printing station of the system of FIG. 4 contact printing a non-wetting agent on the base of FIG. 5A according to one exemplary embodiment.
Figure 5A:
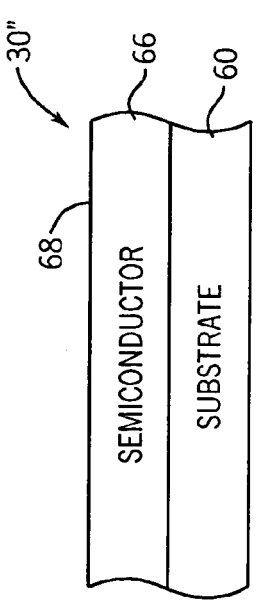
FIG. 5A is a fragmentary sectional view of another embodiment of the base of FIG. 2A according to one exemplary embodiment.

FIGS. 5A-5G schematically illustrate one example process for forming electronic device using system 220 shown in FIG. 4. FIG. 5A illustrates base 30" at location A in FIG. 4 prior to any interaction with the contact printing stations, inkjet printing stations or precursor treatment stations of system 220. As shown by FIG. 5A, base 30" includes substrate 60 and semiconductor 66. Substrate 60 and semiconductor 66 are substantially identical to substrate 60 and semiconductor 66 as described with respect to FIG. 2A. Base 30" is different from base 30 in that base 30" does not include gate 62 or dielectric 64 which are deposited and formed on base 30" by system 220.

Figure 5C:
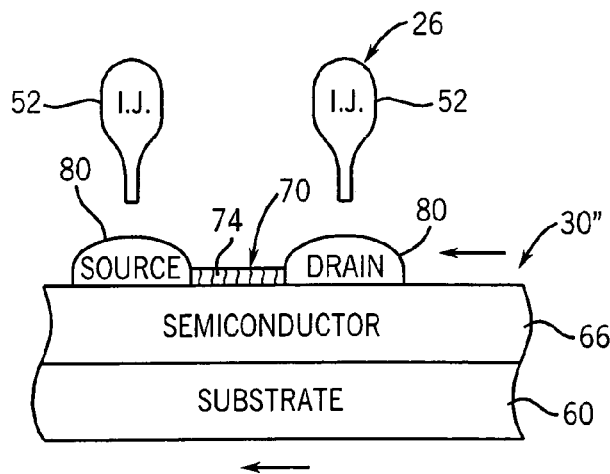
FIG. 5C is a fragmentary sectional view of an inkjet station of the system of FIG. 4 inkjet printing electrically conductive material solution on the base of FIG. 5B along opposite sides of the non-wetting agent according to one exemplary embodiment.

FIGS. 5B and 5C illustrate base 30" at locations B and C in FIG. 4. The process steps illustrated by FIGS. 5B and 5C are substantially identical to the process steps shown and described with respect to FIGS. 2B and 2C, respectively.

Figure 5D:
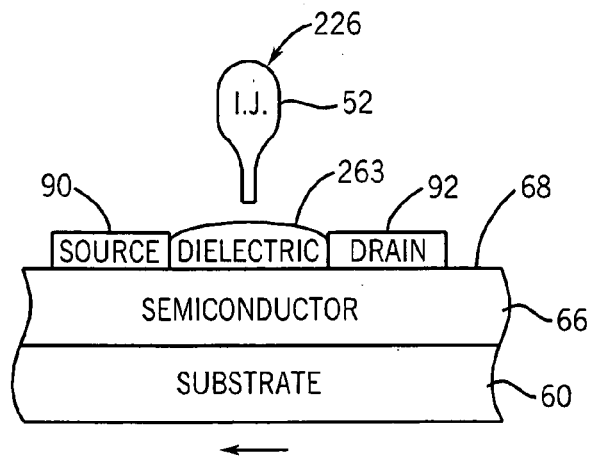
FIG. 5D is a fragmentary sectional view of an inkjet station of the system of FIG. 4 inkjet printing a dielectric material solution between a source electrode and a drain electrode formed on the base of FIG. 5C according to one exemplary embodiment.

FIG. 5D schematically illustrates base 30 at location D in FIG. 4 after the electrically conductive material contained within solution 80 has been solidified at precursor treatment station 28 (shown in FIG. 4) to form source electrode 90 and drain electrode 92 upon semiconductor 66. FIG. 5D further illustrates inkjet station 226, inkjet printing solution 263 containing a solute of dielectric material on surface 68 of semiconductor 66 between source electrode 90 and drain electrode 92. In one embodiment, solution 263 comprises uv curable acrylic monomer. In other embodiments, solution 263 may comprise other solutions such as organic dielectrics, metal oxide sol-gel precursors containing a solute of dielectric material. Once the solution 263 has been inkjet printed or otherwise deposited between source electrode 90 and drain electrode 92, precursor treatment station 228 (shown in FIG. 4) solidifies or drives off the solvent of solution 263 to form dielectric 264 (shown in FIG. 5F). In one embodiment, dielectric 264 is substantially identical to dielectric 64 and comprises uv curable acrylic monomer. In another embodiment, dielectric 264 may comprise other dielectric or insulating materials such as organic dielectrics (poly(vinyl phenol), poly(methyl methacrylate), organosilsesquioxanes, acrylic polymer, UV curable monomer, thermal curable monomer, polymer solution, including melted polymer and/or oligomer solution, benzocyclobutene, and/or one or more polyimides, as just a few examples, metal oxide solgel precursors (a sol-gel comprises partially hydrolyzed/oligomerized metal alkoxides in an alcohol solution). Dielectric 264 electrically isolates source electrode 90 and drain electrode 92 except for current flowing through semiconductor 66. Dielectric 264 further electrically insulates a gate from source electrode 90, drain electrode 92 and semiconductor 66. Although FIG. 5D illustrates dielectric solution 263 as being deposited solely between source 90 and drain 92 such that the resulting dielectric 264 is contained between source 90 and drain 92, solution 263 may alternatively be inkjet printed partially over or completely about source electrode 90 and drain electrode 92 such that the resulting dielectric 264 also extends partially over or completely about source electrode 90 and drain electrode 92.

Figure 5E:
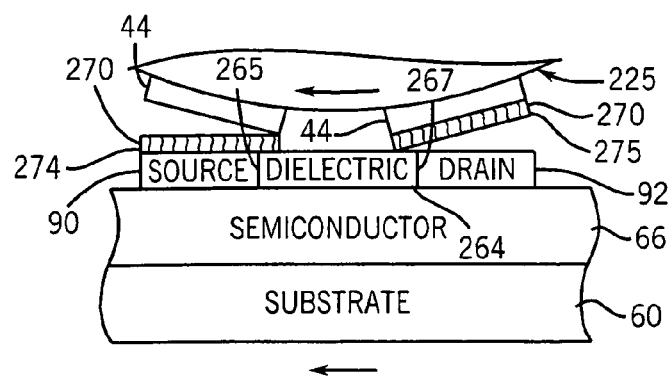
FIG. 5E is a fragmentary sectional view of a contact printing station of the system of FIG. 4 contact printing a non-wetting agent on the source electrode and the drain electrode of FIG. 5D according to one exemplary embodiment.

FIG. 5E schematically illustrates contact printing station 225 contact printing non-wetting agent 270 proximate to dielectric 264. In the particular example illustrated, contact printing station 225 contact prints non-wetting agent 270 at two spaced regions 274, 275 located on opposite sides of dielectric 264. Region 274 extends over source electrode 90 and partially overlies a side 265 of dielectric 264. Region 275 overlies at least a portion of drain electrode 92 and overlies edge 267 of drain electrode 92. In the particular example shown, regions 274 and 275 of non-wetting agent 270 are spaced from one another by a maximum distance of 500 μm, by a minimal distance of 1 μm and by a nominal distance of 10 μm. In the particular example illustrated, non-wetting agent 270 comprises halogenated silane coupling agents such as tridecafluoro (1,1,2,2-tetrahydro)-octyltrichlorosilane. In other embodiments, non-wetting agent 270 comprise other hydrophobic agents such as halogenated silane coupling agents such as tetraoctadecylammonium bromide. Regions 274 and 275 have a sufficient volume or density and are sufficiently phobic so as to repel solution 261 (shown in FIG. 5F).

Figure 5F:
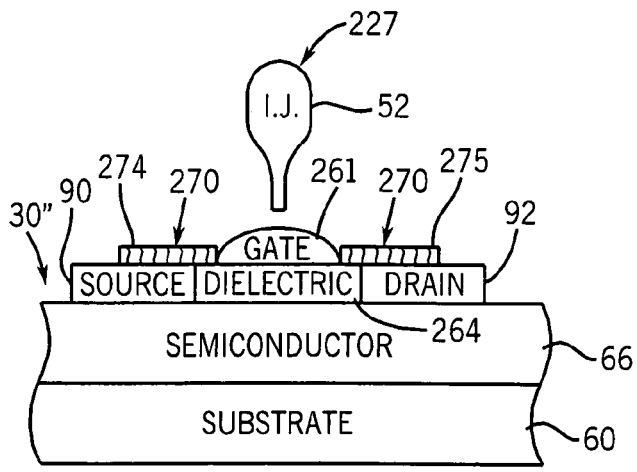
FIG. 5F is a fragmentary sectional view of an inkjet station of the system of FIG. 4 inkjet printing an electrically conductive material solution between regions of the non-wetting agent of FIG. 5E according to one exemplary embodiment.

FIG. 5F schematically illustrates base 30" at location F in FIG. 4 at which inkjet station 227 is inkjet printing solution 261 including a solute of electrically conductive material upon dielectric 264. In the particular example illustrated, inkjet station 227 inkjet prints solution 261 between regions 274 and 275 of non-wetting agent 270. Regions 274 and 275 of non-wetting agent 270 repel solution 261 and contain solution 261 over dielectric 264 and out of contact with source electrode 90 and drain electrode 92. As a result, the width and positioning of gate 262 (shown in FIG. 5G) formed from solution 261 may be precisely controlled. In one particular embodiment, solution 261 comprises an indium tin oxide precursor materials. In other embodiments, solution 261 may comprise other solutions such as tin oxide, zinc oxide, indium oxide, Ag, Cu, and Au precursor solutions including a solute of electrically conductive material.

Figure 5G:
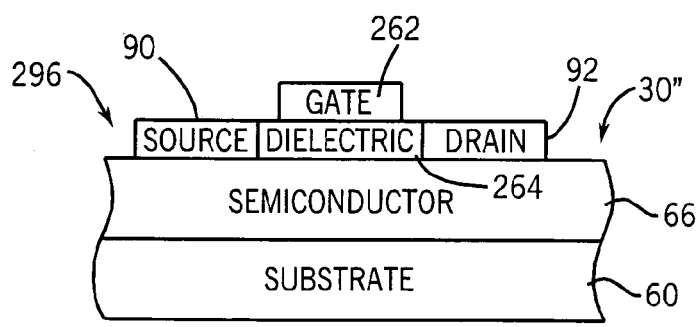
FIG. 5G is a fragmentary sectional view of the base of FIG. 5F after a precursor treatment station of the system of FIG. 4 has solidified electrically conductive material of the solution to form a gate electrode and a thin film transistor device according to one exemplary embodiment.

FIG. 5G illustrates base 30" at location G in FIG. 4 after precursor treatment station 229 has solidified solution 261 to form gate electrode 262. In the embodiment illustrated, precursor treatment station 229 applies heat to thermally anneal solution 261 to form gate electrode 262. In other embodiments, precursor treatment station 229 may direct other forms of energy to solidify electrically conductive material of solution 261 to drive off its solvents. In one embodiment, the resulting gate electrode 262 is formed from an electrically conductive material such as silver. In other embodiments, gate electrode 262 may be formed from other electrically conductive materials such as tin oxide, zinc oxide, indium oxide, Ag, Cu and Au.

Overall, system 220 (shown in FIG. 4) and the example process shown and described with respect to FIGS. 5B-5G may reduce the cost and complexity of the fabrication of field-effect transistor device 296 while reducing the size and improving the performance of device 296. As with field-effect transistor device 96 shown in FIG. 2D, the field-effect transistor device 296 shown in FIG. 2G may have improved electrical contact between source electrode 90, drain electrode 92, and semiconductor 66. In addition, the process disclosed in FIGS. 5B-5G uses additive techniques (contact printing and inkjet printing) to pattern and control the formation of source electrode 90, drain electrode 92, dielectric 264, and gate electrode 262. As a result, relatively complex semiconductor fabrication techniques such as photography and subtractive steps such as etching may be reduced or eliminated. Further, the inkjet printing and micro contact printing are complementary in that they are both effective for large area patterning in a single step and are compatible with non-planar surfaces. The inkjet printing provides a fast digital pattern technique that may be used with large-area flexible substrates. Micro contact printing is a fast patterning technique to allow for formation of high resolution features. Both contact printing and the inkjet printing are compatible with reel-to-reel processing for low cost, macro electronic systems. As a result, the combination of contact printing and inkjet printing disclosed in FIGS. 5B-5G facilitates customization of electronic circuits on the fly with micrometer and nano meter scale resolutions for high resolution definition of channels such as the source, drain, dielectric and gate.

Figure 6A:
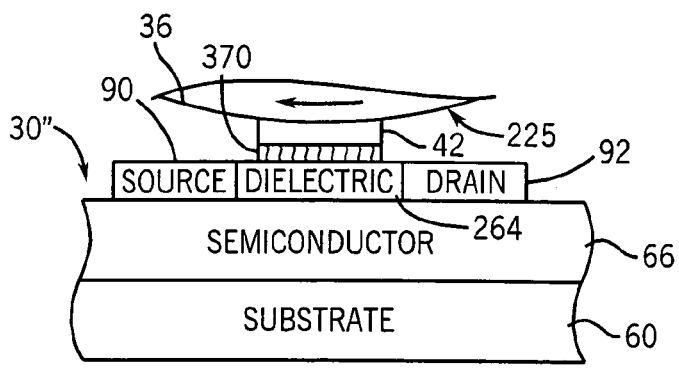
FIG. 6A is a fragmentary sectional view of a contact printing station of the system of FIG. 4 contact printing a wetting agent on the base of FIG. 5D after a dielectric material solution on the base of FIG. 5D has been solidified according to one exemplary embodiment.
Figure 6B:
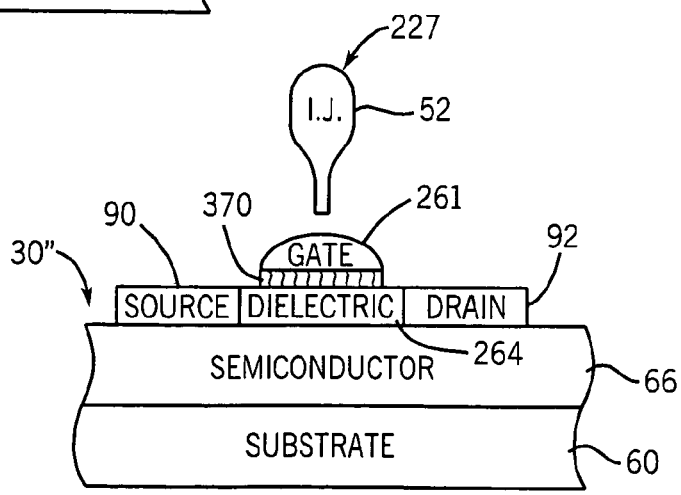
FIG. 6B is a fragmentary sectional view of an inkjet station of the system of FIG. 4 inkjet printing an electrically conductive material solution on the wetting agent of FIG. 6A according to one exemplary embodiment.

FIGS. 6A and 6B schematically illustrate another example process for fabricating a thin film transistor electronic device. In particular, FIGS. 6A and 6B illustrate a variation of the process described in FIGS. 5A-5G. FIGS. 6A and 6B illustrate alternative process steps to the steps shown in FIGS. 5E and 5F, respectively. FIG. 6A illustrates contact printing station 225 contact printing a wetting agent 370 upon dielectric 264 out of contact with source electrode 90 and drain electrode 92. In one embodiment, wetting agent 370 comprises a fluid-philic material such as 11-mercapto-1-undecanol (C11OH). In other embodiments, wetting agent 370 may comprise other philic materials such as those that include alcohol and/or carboxylic acid end groups such as 11-mercaptoundecanoic acid.

FIG. 6B schematically illustrates inkjet station 227 inkjet printing electrically conductive material solution 261 on wetting agent 370 and on dielectric 264. Wetting agent 370 attracts and retains solution 261 over dielectric 264 and spaced from source electrode 90 and drain electrode 92. As shown in FIG. 5G, solution 261 is subsequently solidified by a precursor treatment station 229 (shown in FIG. 4) to solidify the electrically conductive materials of solution 261 so as to form the thin film electronic device 296 shown in FIG. 5G but for any remaining portions of wetting agent 370 between gate electrode 262 and dielectric 264. As with the process shown and described with respect to FIGS. 5A-5G, the alternative process including the steps shown in FIGS. 5B-D, FIGS. 6A-6B and FIG. 5G may reduce the cost and complexity of the fabrication of the field-effect transistor device 296 or reducing the size and improving the performance of device 296.

Figure 7A:
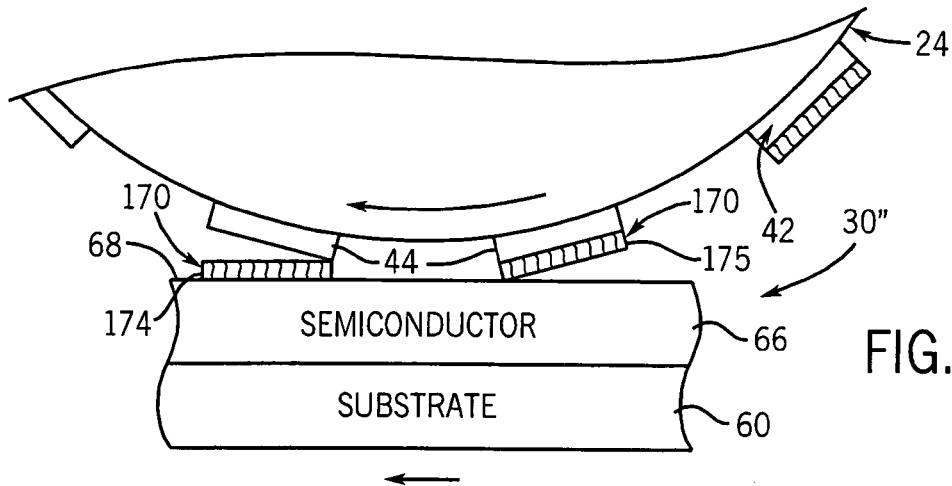
FIG. 7A is a fragmentary sectional view of a contact printing station of the system of FIG. 4 contact printing a wetting agent on the base of FIG. 5A according to one exemplary embodiment.
Figure 7B:
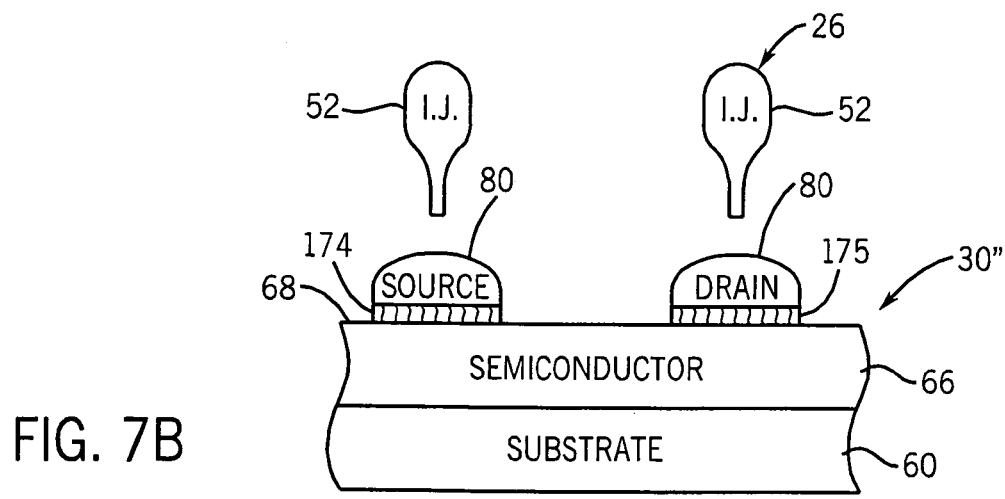
FIG. 7B is a fragmentary sectional view of an inkjet printing station of the system of FIG. 4 inkjet printing an electrically conductive material solution on regions of the wetting agent of FIG. 7A according to one exemplary embodiment.

FIGS. 7A-7F illustrate another example process for fabricating an electronic device. The process shown in FIGS. 7A and 7B is similar to the process shown in FIGS. 3A and 3B except that the process steps are performed on base 30" (shown in FIG. 5A in lieu of base 30' (shown in FIGS. 3A and 3B). In particular, FIG. 7A illustrates contact printing station 24 contact printing wetting agent 170 at regions 174 and 175 on semiconductor 66 of base 30". FIG. 7B schematically illustrates inkjet station 26 inkjet printing electrically conductive material solution 80 on regions 174 and 175 and on semiconductor 66 of base 30".

Figure 7C:
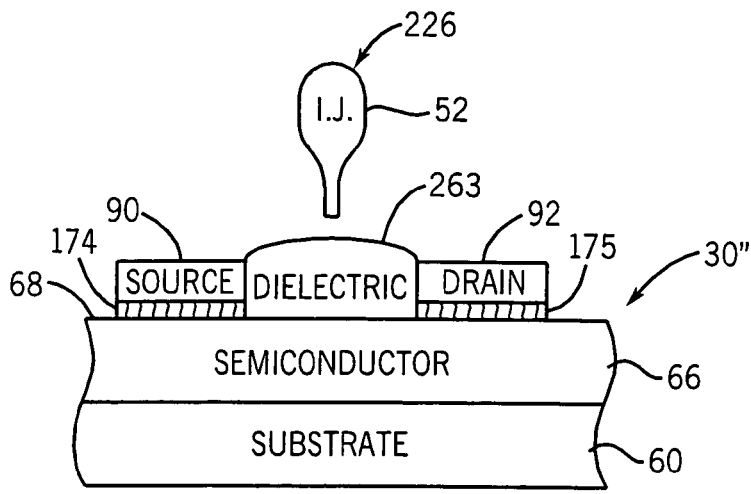
FIG. 7C is a fragmentary sectional view of an inkjet station of the system of FIG. 4 inkjet printing a dielectric material solution on the base of FIG. 7B according to one exemplary embodiment.

The process step shown in FIG. 7C is substantially identical to the process step shown in FIG. 5D. In particular, FIG. 7C schematically illustrates inkjet station 226 inkjet printing dielectric material solution 263 between source electrode 90 and drain electrode 92 and upon semiconductor 66 of base 30". In other embodiments, dielectric material may be deposited between source electrode 90 and drain electrode 92 by other methods.

Figure 7D:
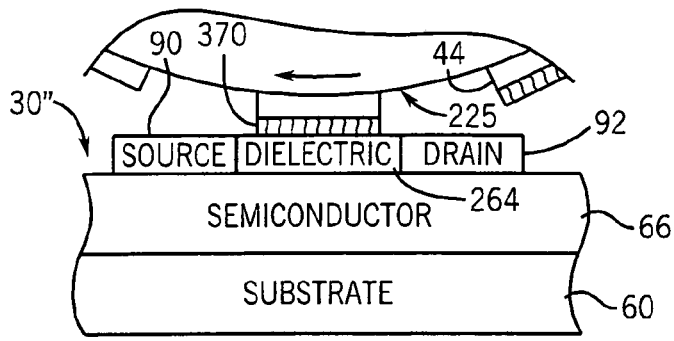
FIG. 7D is a fragmentary sectional view of a contact printing station of the system of FIG. 4 contact printing a wetting agent on a dielectric on the base of FIG. 7C according to one exemplary embodiment.
Figure 7E:
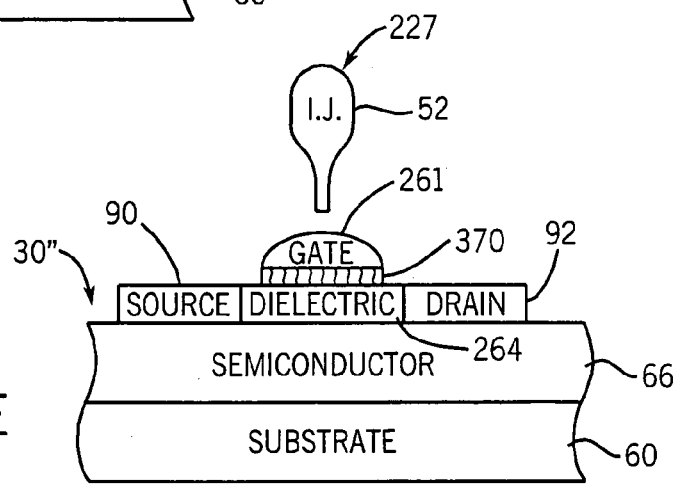
FIG. 7E is a fragmentary sectional view of an inkjet station of the system of FIG. 4 inkjet printing an electrically conductive material solution on the wetting agent of FIG. 7D according to one exemplary embodiment.

FIG. 7D schematically illustrates base 30' after precursor treatment station 228 has solidified the dielectric material of solution 263 and otherwise driven off the solvents to form dielectric 264. FIG. 7D further illustrates contact printing station 225 contact printing wetting agent 370 upon dielectric 264 and out of contact with source electrode 90 and drain electrode 92. FIG. 7E schematically illustrates inkjet printing station 227 electrically conductive material solution 261 upon wetting agent 370.

Figure 7F:
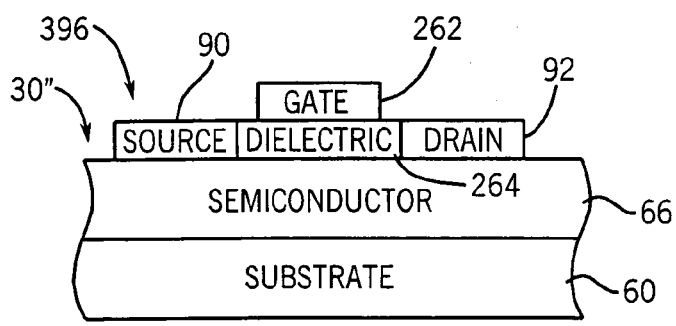
FIG. 7F is a fragmentary sectional view of the base of FIG. 7E after the electrically conductive material of the solution of FIG. 7E has been solidified to form a gate electrode and a thin film transistor device according to one exemplary embodiment.

FIGS. 7D and 7E illustrate process steps substantially identical to the process steps shown in FIGS. 6A and 6B. In particular, FIG. 7F schematically illustrates base 30" after precursor treatment station 229 has solidified the electrically conductive material of solution 261 to form gate electrode 262. As with the process shown and described with respect to FIGS. 6A and 6B, the process shown in FIGS. 7A-7F may reduce the cost and complexity of the fabrication of field-effect transistor device 396 or reducing the size and improving the performance of device 396.

In another embodiment, the process shown and described with respect to FIGS. 7A-7F may alternatively include the process steps shown and described with respect to FIGS. 5E and 5F in lieu of the process steps shown and described with respect to FIGS. 7D and 7E. In particular, in lieu of contact printing station 225 contact printing wetting agent 370 upon dielectric 264 and out of contact with source electrode 90 and drain electrode 92, contact printing station 225 may alternatively contact print non-wetting agent 270 at regions 274 and 275 (shown in FIG. 5E). In lieu of inkjet station 227, inkjet printing electrically conductive material solution 261 upon wetting station 370 inkjet station 227 may alternatively inkjet print electrically conductive material solution 261 between regions 274 and 275 of non-wetting agent 270 as shown in FIG. 5F. Thereafter, precursor treatment station 229 may solidify the electrically conductive material solution 261 to form gate electrode 262 and thin film transistor device 396 as shown in FIG. 7F.

Figure 8A:
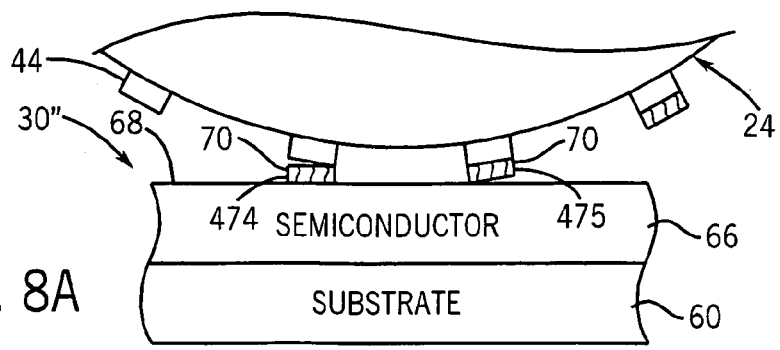
FIG. 8A is a fragmentary sectional view of a contact printing station contact printing a non-wetting agent on the base of FIG. 5A according to one exemplary embodiment.

FIGS. 8A-8D illustrate another example process for forming an electronic device using system 220 shown in FIG. 4. FIG. 8A schematically illustrates contact printing station 24 contact printing non-wetting agent 70 at regions 474 and 475 on surface 68 of semiconductor 66 of base 30". In the particular example illustrated, regions 474 and 475 are spaced from one another by a minimum distance of 50 nm, by a maximum distance of 500 μm and by a nominal distance of 2 μm. Each region 474, 475 has a minimum width of 50 nm, a maximum width of 500 μm and a nominal width of 0.5 μm.

Figure 8B:
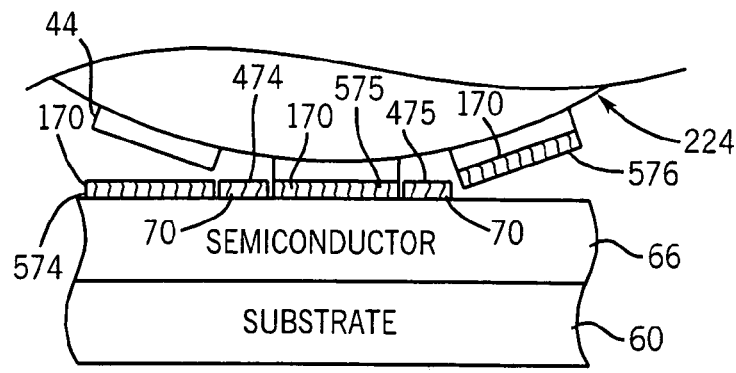
FIG. 8B is a fragmentary sectional view of a contact printing station contact printing a wetting agent on the base of FIG. 8A according to one exemplary embodiment.

FIG. 8B schematically illustrates contact printing station 224 of system 220 in FIG. 4 contact printing wetting agent 170 at regions 574, 575 and 576. Regions 574 and 575 extend on opposite sides of region 474 of non-wetting agent 70. Regions 575 and 576 of wetting agent 170 extend on opposite sides of region 475 of non-wetting agent 170. In one particular embodiment, regions 574, 575 and 576 substantially fill the gap between adjacent regions of non-wetting agent 170. In other embodiments, regions 574, 575 and 576 may be spaced from adjacent regions of non-wetting agent 70.

Figure 8C:
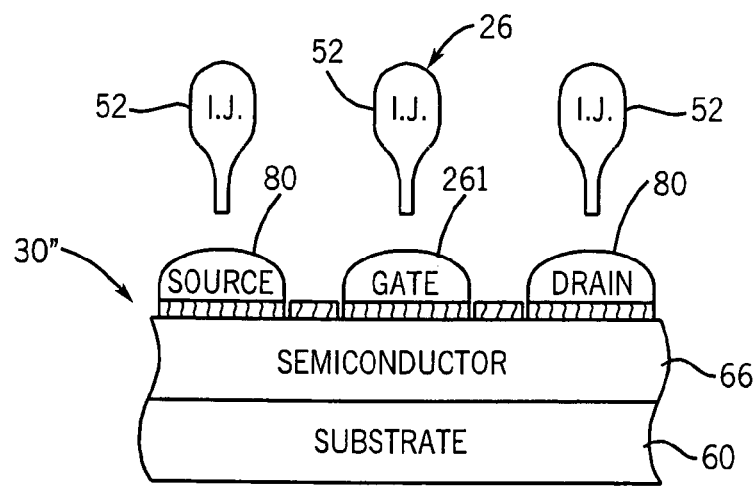
FIG. 8C is a fragmentary sectional view of an inkjet station inkjet printing an electrically conductive material solution on the wetting agent of FIG. 8B according to one exemplary embodiment.

FIG. 8C schematically illustrates inkjet station 26. Inkjet printing an electrically conductive material solution 80 upon regions 574, 575 and 576 of wetting agent 70. Regions 574, 575 and 576 of wetting agent 170 attract solution 180. At the same time, regions 474 and 475 of non-wetting agent 70 repel solution 180. As a result, precise control of the patterning of solution 80 on semiconductor 66 and on base 30" may be achieved.

Figure 8D:
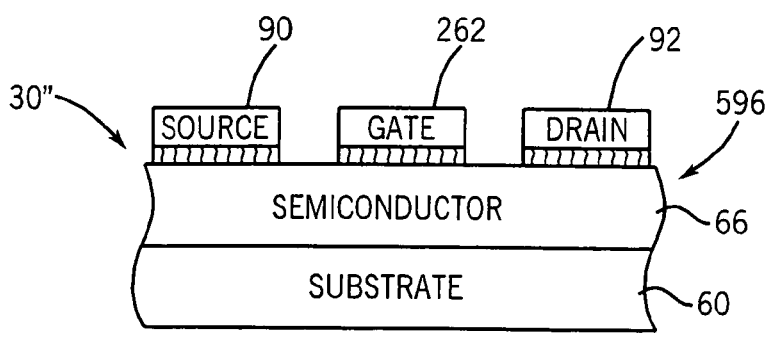
FIG. 8D is a fragmentary sectional view of the electrically conductive material solidified from the solution of FIG. 8C on the base of FIG. 8C according to one exemplary embodiment.

FIG. 8D schematically illustrates base 30" of FIG. 8C after electrically conductive material solute of solution 80 has been solidified by precursor treatment station 28 (shown in FIG. 4) to form source electrode 90, drain electrode 92 and gate electrode 162. Because solution 80 forming source electrode 90, drain electrode 92 and gate electrode 262 is inkjet printed upon wetting agent 170 which are located between regions of non-wetting agent 70, the spacing between electrodes 90, 92, 262 may increase the resolution of the thin film transistor device 596 shown in FIG. 8D. Although the process shown in FIGS. 8A-8D is illustrated for forming a MESFET, the process shown in FIGS. 8A-8D may alternatively be utilized to form a JFET. In other embodiments, a dielectric or insulative material may be formed between gate 262 and semiconductor 66 to fabricate other forms of thin film transistors such as a MISFET or a HFET.

Although the foregoing has been described with reference to example embodiments, workers skilled in the art will recognize that changes may be made in form and detail without departing from the spirit and scope thereof. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present subject matter described with reference to the example embodiments and set forth in the following claims is manifestly intended to be as broad as possible. For example, unless specifically otherwise noted, the claims reciting a single particular element also encompass a plurality of such particular elements.

What is claimed is:

1. A method comprising:
   contact printing one of a wetting agent and a non-wetting agent directly on a semiconductor; and
   inkjet printing an electrically conductive material proximate said one of the wetting agent and the non-wetting agent so as to form a transistor, wherein the electrically conductive material forms a source electrode and wherein a dimension of the source electrode is controlled by said one of the wetting agent and the non-wetting agent.

2. The method of claim 1, wherein the wetting agent is contact printed directly upon the semiconductor and wherein the electrically conductive material is inkjet printed directly on the wetting agent.

3. The method of claim 1, wherein the non-wetting agent is contact printed directly on the semiconductor and wherein the electrically conductive material is inkjet printed adjacent an edge of the non-wetting agent directly on the semiconductor.

4. The method of claim 1, wherein the step of contact printing includes contact printing the wetting agent directly on a first region of the semiconductor and directly on a second region of the semiconductor spaced from the first region and wherein the electrically conductive material is inkjet printed directly on the first region and directly on the second region.

5. The method of claim 1, wherein the step of contact printing includes contact printing the non-wetting agent on the semiconductor and wherein the electrically conductive material is inkjet printed on a first side of the non-wetting agent directly on the semiconductor and on a second side of the non-wetting agent directly on the semiconductor.

6. The method of claim 1, wherein the step of contact printing includes contact printing the non-wetting agent directly on a first region of the semiconductor and directly on a second region of the semiconductor spaced from the first region and wherein the electrically conductive material is inkjet printed between the first region and the second region directly on the semiconductor.

7. The method of claim 1, wherein the step of contact printing includes contact printing the wetting agent directly on a first region of the semiconductor and directly on a second region of the semiconductor spaced from the first region and wherein the method further includes contact printing a non-wetting agent directly on a third region of the semiconductor between the first region and the second region.

8. The method of claim 1, wherein the step of contact printing includes contact printing the non-wetting agent directly on a first region of the semiconductor and directly on a second region of the semiconductor spaced from the first region and wherein the method further includes contact printing a wetting agent directly on a third region of the semiconductor between the first region and the second region.

9. The method of claim 1, wherein the step of inkjet printing includes inkjet printing the electrically conductive material directly on a first region of the semiconductor and directly on a second region of the semiconductor spaced from the first region and wherein the method further includes forming a dielectric between the first region and the second region directly on the semiconductor.

10. The method of claim 9 including depositing an electrically conductive material directly on the dielectric and out of contact with the electrically conductive material on the first region and the second region.

11. The method of claim 10 including depositing a non-wetting agent directly on the electrically conductive material on the first region and the second region and wherein the step of forming includes depositing the electrically conductive material between the non-wetting agent.

12. The method of claim 11, wherein the non-wetting agent is deposited by contact printing the non-wetting agent.

13. The method of claim 12, wherein the electrically conductive material deposited on the dielectric is deposited by inkjet printing.

14. The method of claim 10 including forming a wetting agent directly on the dielectric, wherein the electrically conductive material is deposited directly on the wetting agent.

15. The method of claim 14, wherein the wetting agent is formed on the dielectric by contact printing the wetting agent directly on the dielectric.

16. The method of claim 15, wherein the electrically conductive material is deposited by inkjet printing.

17. The method of claim 1, wherein the semiconductor comprises an inorganic semiconductor.

18. The method of claim 1, wherein the wetting agent is contact printed on the semiconductor and wherein the wetting agent is selected from a group of wetting agents consisting of: molecules of self-assembled monolayers that have hydrophilic end groups.

19. The method of claim 1, wherein the non-wetting agent is contact printed on the semiconductor and wherein the non-wetting agent is selected from a group of non-wetting agents consisting of: molecules of self-assembled monolayers that have hydrophobic end groups.

20. The method of claim 1, wherein the electrically conductive material is selected from a group of materials consisting of: Al, Ti, Ag, Cu, Au, Ta, Ni and Mo.

21. The method of claim 1, wherein the electrically conductive material is inkjet printed as part of a solution and wherein the solution is selected from a group of solutions consisting of: conductive precursor solutions that are either nano-/micro-particle suspensions, sol-gel or other solution based methods, and/or a combination of these.

22. The method of claim 1, wherein the electrically conductive material is inkjet printed as a solution and wherein the method further includes treating the solution to solidify the electrically conductive material.

23. The method of claim 22, wherein treating includes thermally annealing.

24. The method of claim 1, wherein the step of contact printing includes contact printing the non-wetting agent on a semiconductor, wherein the non-wetting agent printed on the semiconductor has a maximum width of 500 μm.

25. The method of claim 1, wherein the step of contact printing includes contact printing a wetting agent on a first region of the semiconductor and on a second region of the semiconductor spaced from the first region, wherein the first region and the second region are spaced no greater than 500 μm from one another.

26. The method of claim 1, wherein the step of contact printing includes rotating a drum having raised portions carrying said one of the wetting agent and the non-wetting agent.

27. The method of claim 1, wherein the semiconductor extends between a first reel and a second reel.

28. The method of claim 1, wherein the electrically conductive material forms a source electrode and a drain electrode.

29. The method of claim 1, wherein the electrically conductive material is inkjet printed on a first side of the semiconductor and wherein a gate electrode is coupled to the semiconductor on a second side of the semiconductor.

30. The method of claim 29, wherein a dielectric is coupled between the gate electrode and the second side of the semiconductor.

31. The method of claim 1, wherein the electric conductive material is inkjet printed as a solution and wherein the method further includes treating the solution with microwaves to crystallize the electrically conductive material.

32. The method of claim 31, wherein the electrically conductive material is selected from a group of materials consisting of: Al, Ti, Ag, Cu, Au, Ta, Ni and Mo.

33. The method of claim 31, wherein the semiconductor extends between a first reel and a second reel.

34. The method of claim 33 further comprising unwinding a base from a first real and winding the base on a second reel, wherein the base includes the semiconductor.

35. The method of claim 34, where the base includes a dielectric layer extending from the first reel to the second reel.

36. The method of claim 35, wherein the base includes an electrically conductive gate layer extending from the first reel to the second reel and wherein the electrically conductive material inkjet printed forms at least one of a source electrode and a drain electrode.

37. The method of claim 27 further comprising unwinding a base from a first reel and winding the base on a second reel, wherein the base includes the semiconductor.

38. The method of claim 37, where the base includes a dielectric layer extending from the first reel to the second reel.

39. The method of claim 38, wherein the base includes an electrically conductive gate layer extending from the first reel to the second reel and wherein the electrically conductive material inkjet print head forms at least one of a source electrode and a drain electrode.

40. The method of claim 27, wherein the electrically conductive material is selected from a group of materials consisting of: Al, Ti, Ag, Cu, Au, Ta, Ni and Mo.

41. A method comprising:
contact printing one of a wetting agent and a non-welling agent on a semiconductor; and
inkjet printing an electrically conductive material proximate said one of the wetting agent and the non-welling agent, wherein the electrically conductive material is inkjet printed as a solution and wherein the method further includes treating the solution with microwaves to crystallize the electrically conductive material.

42. The method of claim 41, wherein the semiconductor extends between a first reel and a second reel.

43. The method of claim 41 further comprising unwinding a base from a first reel and winding the base on a second reel, wherein the base includes the semiconductor.

44. The method of claim 43, where the base includes a dielectric layer extending from the first reel to the second reel.

45. The method of claim 44, wherein the base includes an electrically conductive gate layer extending from the first reel to the second reel and wherein the electrically conductive material inkjet print head forms at least one of a source electrode and a drain electrode.

46. A method comprising:
contact printing one of a welling agent and a non-welling agent on a semiconductor;
inkjet printing an electrically conductive material proximate said one of the welling agent and the non-welling agent, wherein the semiconductor extends between a first reel and a second reel;
unwinding a base from a first reel and winding the base on a second reel, wherein the base includes the semiconductor and where the base includes a dielectric layer extending from the first reel to the second reel.

47. A method comprising:
contact printing one of a wetting agent and a non-welling agent directly on a semiconductor; and
inkjet printing an electrically conductive material proximate said one of the wetting agent and the non-welling agent so as to form a transistor,
wherein the step of contact printing includes contact printing the non-welling agent on the semiconductor and wherein the electrically conductive material is inkjet printed on a first side of the non-welling agent directly on the semiconductor and on a second side of the non-welling agent directly on the semiconductor.

48. A method comprising:
contact printing one of a welling agent and a non-welling agent directly on a semiconductor; and
inkjet printing an electrically conductive material proximate said one of the welling agent and the non-welling agent so as to form a transistor,
wherein the step of contact printing includes contact printing the non-welling agent directly on a first region of the semiconductor and directly on a second region of the semiconductor spaced from the first region and wherein the electrically conductive material is inkjet printed between the first region and the second region directly on the semiconductor.

49. A method comprising:
contact printing one of a welling agent and a non-welling agent directly on a semiconductor; and
inkjet printing an electrically conductive material proximate said one of the welling agent and the non-welling agent so as to form a transistor,
wherein the step of contact printing includes contact printing the welling agent directly on a first region of the semiconductor and directly on a second region of the semiconductor spaced from the first region and wherein the method further includes contact printing a non-welling agent directly on a third region of the semiconductor between the first region and the second region.

50. A method comprising:
contact printing one of a wetting agent and a non-welling agent directly on a semiconductor; and
inkjet printing an electrically conductive material proximate said one of the wetting agent and the non-welling agent so as to form a transistor,
wherein the step of contact printing includes contact printing the non-welling agent directly on a first region of the semiconductor and directly on a second region of the semiconductor spaced from the first region and wherein the method further includes contact printing a welling agent directly on a third region of the semiconductor between the first region and the second region.

51. A method comprising:

contact printing one of a welling agent and a non-welling agent directly on a semiconductor, wherein the semiconductor extends between a first reel and a second reel; and inkjet printing an electrically conductive material proximate said one of the welling agent and the non-welling agent so as to form a transistor; and unwinding a base from a first reel and winding the base on a second reel, wherein the base includes the semiconductor.

52. The method of claim 51, where the base includes a dielectric layer extending from the first reel to the second reel.

53. The method of claim 52, wherein the base includes an electrically conductive gate layer extending from the first reel to the second reel and wherein the electrically conductive material inkjet print head forms at least one of a source electrode and a drain electrode.

* * * * *

UNITED STATES PATENT AND TRADEMARK OFFICE
CERTIFICATE OF CORRECTION

PATENT NO. : 7,670,882 B2  Page 1 of 2
APPLICATION NO. : 11/099132
DATED : March 2, 2010
INVENTOR(S) : Gregory S. Herman et al.

It is certified that error appears in the above-identified patent and that said Letters Patent is hereby corrected as shown below:

In column 14, line 65, in Claim 23, delete "thermally" and insert -- thermal --, therefor.

In column 15, line 35, in Claim 34, delete "real" and insert -- reel --, therefor.

In column 15, line 58, in Claim 41, delete "non-welling" and insert -- non-wetting --, therefor.

In column 15, line 61, in Claim 41, delete "non-welling" and insert -- non-wetting --, therefor.

In column 16, line 12, in Claim 46, delete "welling" and insert -- wetting --, therefor.

In column 16, line 12, in Claim 46, delete "non-welling" and insert -- non-wetting --, therefor.

In column 16, line 15, in Claim 46, delete "welling" and insert -- wetting --, therefor.

In column 16, line 15, in Claim 46, delete "non-welling" and insert -- non-wetting --, therefor.

In column 16, line 23, in Claim 47, delete "non-welling" and insert -- non-wetting --, therefor.

In column 16, line 26, in Claim 47, delete "non-welling" and insert -- non-wetting --, therefor.

In column 16, line 29, in Claim 47, delete "non-welling" and insert -- non-wetting --, therefor.

In column 16, line 31, in Claim 47, delete "non-welling" and insert -- non-wetting --, therefor.

In column 16, lines 32-33, in Claim 47, delete "non-welling" and insert -- non-wetting --, therefor.

In column 16, line 35, in Claim 48, delete "welling" and insert -- wetting --, therefor.

In column 16, line 35, in Claim 48, delete "non-welling" and insert -- non-wetting --, therefor.

In column 16, line 38, in Claim 48, delete "welling" and insert -- wetting --, therefor.

In column 16, line 38, in Claim 48, delete "non-welling" and insert -- non-wetting --, therefor.

In column 16, line 41, in Claim 48, delete "non-welling" and insert -- non-wetting --, therefor.

In column 16, line 48, in Claim 49, delete "welling" and insert -- wetting --, therefor.

In column 16, line 48, in Claim 49, delete "non-welling" and insert -- non-wetting --, therefor.

In column 16, line 51, in Claim 49, delete "welling" and insert -- wetting --, therefor.

Signed and Sealed this

Twenty-second Day of June, 2010

David J. Kappos
*Director of the United States Patent and Trademark Office*

CERTIFICATE OF CORRECTION (continued)
U.S. Pat. No. 7,670,882 B2

In column 16, line 51, in Claim 49, delete "non-welling" and insert -- non-wetting --, therefor.

In column 16, line 54, in Claim 49, delete "welling" and insert -- wetting --, therefor.

In column 16, lines 57-58, in Claim 49, delete "non-welling" and insert -- non-wetting --, therefor.

In column 16, line 61, in Claim 50, delete "non-welling" and insert -- non-wetting --, therefor.

In column 16, line 64, in Claim 50, delete "non-welling" and insert -- non-wetting --, therefor.

In column 16, line 67, in Claim 50, delete "non-welling" and insert -- non-wetting --, therefor.

In column 17, line 3, in Claim 50, delete "welling" and insert -- wetting --, therefor.

In column 17, line 7, in Claim 51, delete "welling" and insert -- wetting --, therefor.

In column 17, line 7, in Claim 51, delete "non-welling" and insert -- non-wetting --, therefor.

In column 17, line 11, in Claim 51, delete "welling" and insert -- wetting --, therefor.

In column 17, line 11, in Claim 51, delete "non-welling" and insert -- non-wetting --, therefor.